(12) United States Patent
Lee

(10) Patent No.: US 9,230,693 B1
(45) Date of Patent: Jan. 5, 2016

(54) REPAIR CIRCUIT AND SEMICONDUCTOR MEMORY DEVICE INCLUDING THE SAME

(71) Applicant: SK hynix Inc., Gyeonggi-do (KR)

(72) Inventor: Joo-Hyeon Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/688,789

(22) Filed: Apr. 16, 2015

(30) Foreign Application Priority Data

Dec. 8, 2014 (KR) ........................ 10-2014-0174929

(51) Int. Cl.
| | |
|---|---|
| *G11C 29/00* | (2006.01) |
| *G11C 29/04* | (2006.01) |
| *G11C 17/16* | (2006.01) |
| *G11C 17/18* | (2006.01) |

(52) U.S. Cl.
CPC ................ *G11C 29/78* (2013.01); *G11C 17/16* (2013.01); *G11C 17/18* (2013.01); *G11C 29/04* (2013.01)

(58) Field of Classification Search
USPC ........................................ 365/200, 230.03, 96
See application file for complete search history.

(56) References Cited

U.S. PATENT DOCUMENTS

| | | | | |
|---|---|---|---|---|
| 2007/0047347 A1* | 3/2007 | Byun | ..................... | G11C 29/44 365/201 |
| 2011/0271157 A1* | 11/2011 | Lee | ........................ | G11C 29/40 714/718 |

FOREIGN PATENT DOCUMENTS

KR          100855270          9/2008

* cited by examiner

*Primary Examiner* — Vu Le
(74) *Attorney, Agent, or Firm* — IP & T Group LLP

(57) ABSTRACT

A repair circuit includes a test data processing unit that outputs first and second fail detection signals using first and second test data of first and second memory banks, respectively, in response to a test mode signal, a repair address control unit that sets a priority of the first and second memory banks and selectively stores first and second addresses of the first and second memory banks based on the set priority in response to the first and second fail detection signals, and a fuse unit that performs repair programming based on the addresses selectively stored in the repair address control unit.

14 Claims, 4 Drawing Sheets

REPAIR CIRCUIT AND SEMICONDUCTOR MEMORY DEVICE INCLUDING THE SAME

CROSS-REFERENCE TO RELATED APPLICATIONS

The present application claims priority of Korean Patent Application No. 10-2014-0174929, filed on Dec. 8, 2014, which is incorporated herein by reference in its entirety.

BACKGROUND

1. Field

Exemplary embodiments of the present invention relate to a semiconductor design technology and, more particularly, to a semiconductor memory device that performs a repair operation through self-address rupture.

2. Description of the Related Art

A defective memory cell of a semiconductor memory device may be repaired in the wafer or package state. For a repair operation, repair addresses of defective memory cells may be programmed in a fuse unit. Specifically, for a repair operation in the package state, the repair addresses may be programmed in the fuse unit through self-address rupture. In contrast, repair operations n the wafer state are accomplished by external testing equipment. FIG. 1 is a block diagram for illustrating a repair operation through self-address rupture in a typical semiconductor memory device.

Referring to FIG. 1, the semiconductor memory device includes a bank group 110, a test data processing unit 120, a repair address latching unit 130, and a fuse unit 140.

The bank group 110 includes a plurality of memory cell arrays, and outputs a plurality of pieces of test data GIO_DATA<0:N> in a compression test mode. A compression test is used in order to reduce a test time, and is performed by writing substantially the same data in a plurality of memory cells in a write operation, and compressing and outputting data of the plurality of memory cells in a read operation.

The test data processing unit 120 combines the plurality of pieces of test data GIO_DATA<0:N> with one another and outputs a fail detection signal GIO_FAIL when a self-address rupture signal SELF_RUP is received. When all the plurality of pieces of test data GIO_DATA<0:N> do not have substantially the same value, the test data processing unit 120 determines a corresponding bank as a failed bank and generates the fail detection signal GIO_FAIL. The self-address rupture signal SELF_RUP is outputted from a mode register set, and is directly received from outside (e.g. an external piece of testing equipment or a host) of the semiconductor memory device, or is generated inside the semiconductor memory device.

The repair address latching unit 130 latches addresses ADD<0:K> corresponding to the failed bank in response to the fail detection signal GIO_FAIL. When the fail detection signal GIO_FAIL is activated and a bank is determined to have failed, the repair address latching unit 130 stores the addresses ADD<0:K> applied to the repair address latching unit 130. The addresses ADD<0:K> applied to the repair address latching unit 130 correspond to addresses of a bank in which the plurality of pieces of test data GIO_DATA<0:N> have been stored.

The fuse unit 140 includes a fuse set, and electrically programs repair addresses ADD_LAT<0:K> outputted from the repair address latching unit 130 in the fuse set when a rupture enable signal RUP_EN has been activated. The fuse unit 140 receives excess current or high voltage and performs programming work for changing electrical connection states of respective fuses.

FIG. 2 is a detailed circuit diagram of the repair address latching unit 130 illustrated in FIG. 1.

Referring to FIG. 2, the repair address latching unit 130 includes a pass gate PG that is driven in response to the fail detection signal GIO_FAIL, and a latch section 210 that latches the addresses ADD<0:K> depending on whether the pass gate PG is driven.

The pass gate PG selectively transfers the received addresses ADD<0:K> under the control of the fail detection signal GIO_FAIL, and the latch section 210 stores a signal transferred from the pass gate PG.

As described above, in the repair operation through the self-address rupture, it is determined through the plurality of pieces of test data GIO_DATA<0:N> outputted from the bank whether the bank is failed. Addresses corresponding to a bank determined to be failed are stored, and the stored addresses are programmed. In such a repair operation, since it is possible to efficiently detect a repair address through the compression test, repair address programming work is efficiently performed.

In a memory chip used in the mobile field, the bank structure is divided into a first area (left) and a second area (right) other than a single area, and a repair operation is performed. That is, when failure occurs in the first area (left) or the second area (right), a repair operation of a corresponding area is performed. However, when failure simultaneously occurs in the first area (left) and the second area (right), a repair operation of the corresponding areas may not be properly performed due to a collision of information reporting the occurrence of failure.

SUMMARY

Various embodiments are directed to a semiconductor memory device capable of setting a priority of a bank group and latching repair address information, thereby simultaneously performing a repair operation through self-rupture for first and second sub-banks.

In an embodiment, a repair circuit may include a test data processing unit suitable for outputting first and second fail detection signals using first and second test data of first and second memory banks, respectively, in response to a test mode signal, a repair address control unit suitable for setting a priority of the first and second memory banks and selectively storing first and second addresses of the first and second memory banks based on the set priority in response to the first and second fail detection signals, and a fuse unit suitable for performing repair programming based on the addresses selectively stored in the repair address control unit.

Preferably, the repair address control unit may include an output control section suitable for selectively outputting the first and second addresses based on the set priority in response to the first and second fail detection signals, and a latch section suitable for latching the address selectively outputted from the output control section.

Preferably, the test data processing unit may combine the first and second test data and output the first and second fail detection signals respectively, in response to the test mode signal.

Preferably, when failures occur in the first test data, the test data processing unit may activate the first fail detection signal, and when failures occur in the second test data, the test data processing unit may activate the second fail detection signal.

Preferably, the fuse unit may program the addresses selectively stored in the repair address control unit as repair address information in response to a rupture enable signal.

The repair circuit may further include a test mode setting unit suitable for generating an additional test operation signal in response to the test mode signal when all the first and second fail detection signals are activated.

The additional test operation signal may include a signal for additionally performing a test operation which is performed in response to the test mode signal.

The test mode signal may include a signal for performing a self-address rupture operation of the first and second memory banks.

The fuse unit may include a fuse set corresponding to the first and second memory banks.

The repair circuit may further include a plurality of memory bank groups includes the first and second memory banks.

Preferably, when failure occurs in one or more of a plurality of pieces of test data outputted from the plurality of memory banks groups, the test data processing unit may output the fail detection signal corresponding to the failed test data in response to the test mode signal.

Preferably, the repair address control unit may set a priority of the plurality of memory bank groups and selectively store the address based on the set priority in response to the plurality of fail detection signals.

In another embodiment, a method of operating a repair circuit may include setting a priority of first and second memory banks, performing a test operation on the first and second memory banks to generate first and second fail detection signals, respectively, selectively storing first and second addresses of the first and second memory banks based on the set priority in response to the first and second fail detection signals, and programming the selectively stored addresses.

In accordance with the semiconductor memory device according to the exemplary embodiment, in a repair operation through self-rupture, repair address information is latched by a preset priority of a bank group, so that it is possible to simultaneously perform the repair operation for first and second sub-banks.

DETAILED DESCRIPTION

Figure 1:
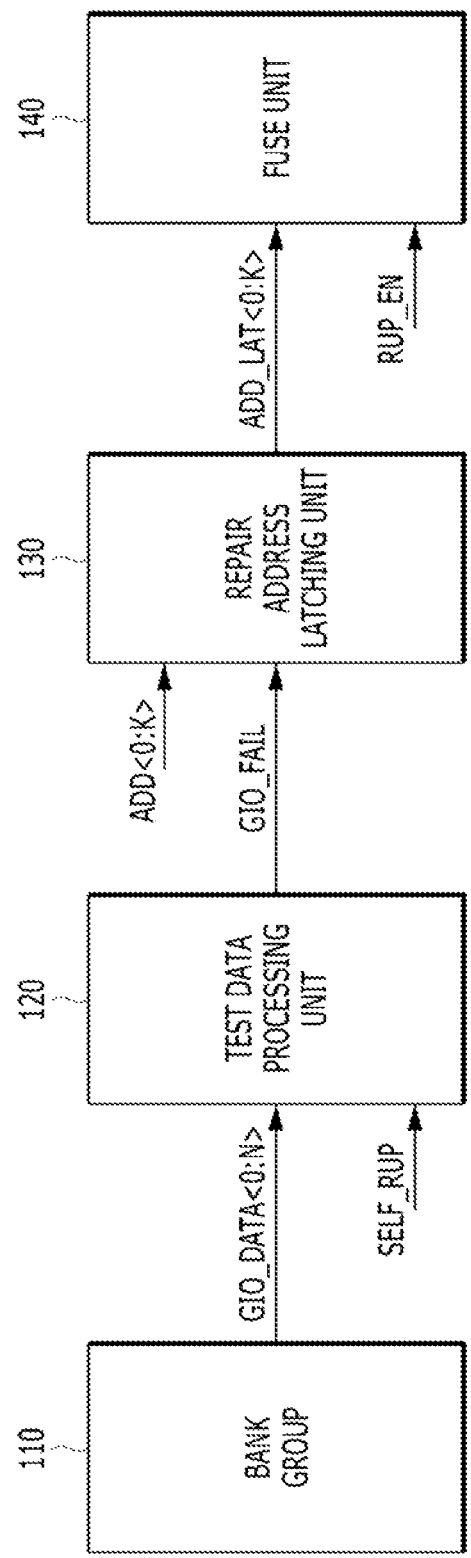
FIG. 1 is a block diagram for illustrating a repair operation through self-address rupture of a typical semiconductor memory device.
Figure 2:
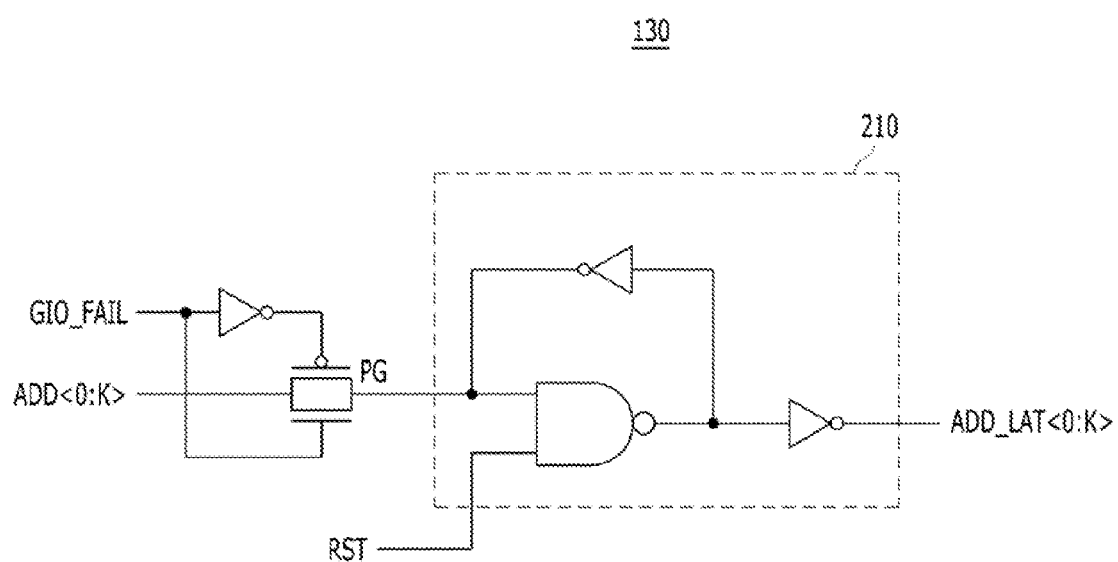
FIG. 2 is a detailed circuit diagram of a repair address latching unit illustrated in FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to where the first layer is formed directly on the second layer or the substrate but also to where a third layer exists between the first layer and the second layer or the substrate.

Figure 3:
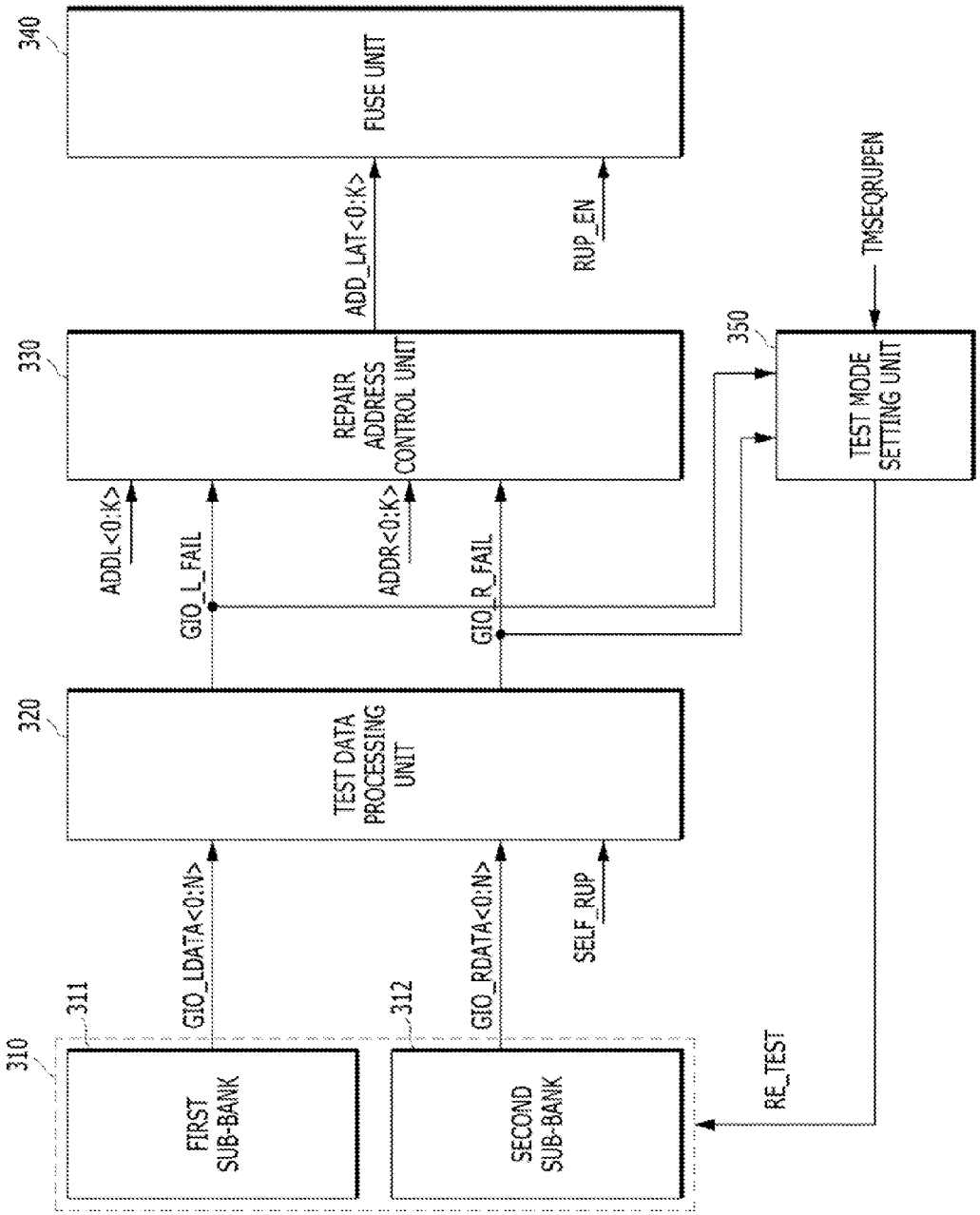
FIG. 3 is a block diagram of a semiconductor memory device in accordance with an embodiment of the present invention.

FIG. 3 is a block diagram of a semiconductor memory device in accordance with an embodiment of the present invention.

Referring to FIG. 3, the semiconductor memory device may include a bank group 310, a test data processing unit 320, a repair address control unit 330, a fuse unit 340, and a test mode setting unit 350.

The bank group 310 may include a first sub-bank 311 and a second sub-bank 312. The first and second sub-banks 311 and 312 each may include a plurality of banks, wherein the plurality of banks each may include a plurality of memory cell arrays. The structure of a single bank group of a semiconductor memory chip used in mobile products may include the first and second sub-banks 311 and 312.

When a compression test is performed, the first sub-bank 311 and the second sub-bank 312 may respectively output a plurality of pieces of first test data GIO_LDATA<0:N> and a plurality of pieces of second test data GIO_RDATA<0:N> through a global data line GIO or a test global data line TGIO.

The test data processing unit 320 may combine the plurality of pieces of first test data GIO_LDATA<0:N> with one another and output a first fail detection signal GIO_L_FAIL when a self-address rupture signal SELF_RUP is received. When the self-address rupture signal SELF_RUP is received, the test data processing unit 320 may combine the plurality of pieces of second test data GIO_RDATA<0:N> with one another and output a second fail detection signal GIO_R_FAIL. The self-address rupture signal SELF_RUP is a test mode signal for performing a self-address rupture operation of the bank group 310, and may be outputted from a mode register set, may be directly received from outside of the semiconductor memory device, or may be generated inside the semiconductor memory device.

The test data processing unit 320 may include a logic section that performs an AND operation or a NAND operation on the plurality of pieces of first and second test data GIO_LDATA<0:N> and GIO_RDATA<0:N>, and outputs the first and second fail detection signals GIO_L_FAIL and GIO_R_FAIL. When all the plurality of pieces of first test data GIO_LDATA<0:N> do not have substantially the same value, the test data processing unit 320 may determine a corresponding bank of the first sub-bank 311 as a failed bank and generate the first fail detection signal GIO_L_FAIL. When all the plurality of pieces of second test data GIO_RDATA<0:N> do not have substantially the same value, the test data processing unit 320 may determine a corresponding bank of the second sub-bank 312 as a failed bank and generate the second fail detection signal GIO_R_FAIL.

The repair address control unit 330 may latch first addresses ADDL<0:K> and second addresses ADDR<0:K> corresponding to the failed banks in response to the first and second fail detection signals GIO_L_FAIL and GIO_R_FAIL. The repair address control unit 330 may output the latched first addresses ADDL<0:K> or second addresses ADDR<0:K> as repair addresses ADDL_LAT<0:K> based on a preset priority of a bank group. The first addresses ADDL<0:K> may be addresses of a bank having outputted the plurality of pieces of first test data GIO_LDATA<0:N. The second addresses ADDR<0:K> may be addresses of a bank having outputted the plurality of pieces of second test data GIO_RDATA<0:N>. When the first and second fail detection signals GIO_L_FAIL and GIO_R_FAIL are activated and corresponding banks are determined to be failed, addresses of the corresponding banks may be stored in the repair address control unit 330.

For example, when the first sub-bank 311 has been previously set as the priority of the bank group in the repair address control unit 330, the repair address control unit 330 may latch and output the first addresses ADDL<0:K> corresponding to the first sub-bank 311 even though the first and second fail detection signals GIO_L_FAIL and GIO_R_FAIL are simultaneously received.

Accordingly, even though a test is simultaneously performed for the first sub-bank 311 and the second sub-bank 312, the repair address control unit 330 may output latched addresses as repair addresses based on the preset priority of the bank group, so that it is possible to prevent the first sub-bank 311 and the second sub-bank 312 from colliding with each other over the repair addresses.

The fuse unit 340 may include fuse sets (not illustrated) corresponding to the first sub-bank 311 and the second sub-bank 312. When a rupture enable signal RUP_EN is received, the fuse unit 340 may electrically program the repair addresses ADDL_LAT<0:K> outputted from the repair address control unit 330 in the fuse sets.

The test mode setting unit 350 may receive the first and second fail detection signals GIO_L_FAIL and GIO_R_FAIL from the test data processing unit 320. The test mode setting unit 350 may receive an additional test mode signal TMSEQRUPEN. The additional test mode signal TMSEQRUPEN is a test mode signal that is activated after a repair operation of the semiconductor memory device is performed, and may be activated before a normal operation of the semiconductor memory device is performed.

When only one of the first and second fail detection signals GIO_L_FAIL and GIO_R_FAIL is activated, the test mode setting unit 350 may deactivate an additional test operation signal RE_TEST in response to the additional test mode signal TMSEQRUPEN. When all the first and second fail detection signals GIO_L_FAIL and GIO_R_FAIL are activated, the test mode setting unit 350 may activate the additional test operation signal RE_TEST in response to the additional test mode signal TMSEQRUPEN.

The bank group 310 may perform a test of the first sub-bank 311 and the second sub-bank 312 again in response to the additional test operation signal RE_TEST.

Next, an operation of the semiconductor memory device will be described.

An example in which a failure has occurred in a bank included in the first sub-bank 311 will now be described.

When a test is simultaneously performed for the first sub-bank 311 and the second sub-bank 312, the plurality of pieces of first and second test data GIO_LDATA<0:N> and GIO_RDATA<0:N> may be outputted from the first sub-bank 311 and the second sub-bank 312 to the test data processing unit 320. As the self-address rupture signal SELF_RUP is activated, the test data processing unit 320 may combine the plurality of pieces of first and second test data GIO_LDATA<0:N> and GIO_RDATA<0:N> with each other, and detect that a failure has occurred in a bank included in the first sub-bank 311 to activate and output the first fail detection signal GIO_L_FAIL. The test data processing unit 320 may deactivate the second fail detection signal GIO_R_FAIL as no failure occurs in a bank included in the second sub-bank 312. The activated first fail detection signal GIO_L_FAIL and the deactivated second fail detection signal GIO_R_FAIL may be inputted to the repair address control unit 330 and the test mode setting unit 350.

Accordingly, the repair address control unit 330 may output the first addresses ADDL<0:K> to the fuse unit 340 as the repair addresses ADDL_LAT<0:K> in response to the first fail detection signal GIO_L_FAIL. The fuse unit 340 may program a fuse set corresponding to the repair addresses ADDL_LAT<0:K> in response to the rupture enable signal RUP_EN. After the repair operation of the semiconductor memory device is performed through information programmed in the fuse unit 340 the additional test mode signal TMSEQRUPEN may be inputted to the test mode setting unit 350. The test mode setting unit 350 may receive the activated first fail detection signal GIO_L_FAIL and the deactivated second fail detection signal GIO_R_FAIL from the test data processing unit 320, and deactivate the additional test operation signal RE_TEST in response to the additional test mode signal TMSEQRUPEN.

Next, an example in which a failure has occurred in a bank included in the second sub-bank 312 will be described.

When a test is simultaneously performed for the first sub-bank 311 and the second sub-bank 312, the plurality of pieces of first and second test data GIO_LDATA<0:N> and GIO_RDATA<0:N> may be outputted from the first sub-bank 311 and the second sub-bank 312 to the test data processing unit 320. As the self-address rupture signal SELF_RUP is activated, the test data processing unit 320 may combine the plurality of pieces of first and second test data GIO_LDATA<0:N> and GIO_RDATA<0:N> with each other, and detect that a failure has occurred in a bank included in the second sub-bank 312 to activate and output the second fail detection signal GIO_R_FAIL. The test data processing unit 320 may deactivate the first fail detection signal GIO_L_FAIL as no failure has occurred in a bank included in the first sub-bank 311. The deactivated first fail detection signal GIO_L_FAIL and the activated second fail detection signal GIO_R_FAIL may be inputted to the repair address control unit 330 and the test mode setting unit 350.

Accordingly, the repair address control unit 330 may output the second addresses ADDR<0:K> to the fuse unit 340 as the repair addresses ADDL_LAT<0:K> in response to the second fail detection signal GIO_R_FAIL. The fuse unit 340 may program a fuse set corresponding to the repair addresses ADDL_LAT<0:K> in response to the rupture enable signal RUP_EN. After the repair operation of the semiconductor memory device is performed through information programmed in the fuse unit 340, the additional test mode signal TMSEQRUPEN may be inputted to the test mode setting unit 350. The test mode setting unit 350 may receive the deactivated first fail detection signal GIO_L_FAIL and the activated second fail detection signal GIO_R_FAIL from the test data processing unit 320, and deactivate the additional test operation signal RE_TEST in response to the additional test mode signal TMSEQRUPEN.

Now, an example in which failures have simultaneously occurred in banks included in the first sub-bank 311 and the second sub-bank 312 will be described.

When a test is simultaneously performed for the first sub-bank 311 and the second sub-bank 312, the plurality of pieces of first and second test data GIO_LDATA<0:N> and GIO_RDATA<0:N> may be outputted from the first sub-bank 311 and the second sub-bank 312 to the test data processing unit 320. As the self-address rupture signal SELF_RUP is activated, the test data processing unit 320 may combine the plurality of pieces of first and second test data GIO_LDATA<0:N> and GIO_R_DATA<0:N> with each other. As failures occur in banks included in the first sub-bank 311 and the second sub-bank 312, the first and second fail detection signals GIO_L_FAIL and GIO_R_FAIL may be simultaneously activated. The activated first and second fail detection signals GIO_L_FAIL and GIO_R_FAIL may be inputted to the repair address control unit 330 and the test mode setting unit 350.

Accordingly, the repair address control unit 330 may output the first addresses ADDL<0:K> or the second addresses ADDR<0:K> to the fuse unit 340 as the repair addresses ADDL_LAT<0:K> based on a preset priority of a bank group. The fuse unit 340 may program a fuse set corresponding to the repair addresses ADDL_LAT<0:K> in response to the rupture enable signal RUP_EN.

After the repair operation of the semiconductor memory device is performed through information programmed in the fuse unit 340, the additional test mode signal TMSEQRUPEN may be inputted to the test mode setting unit 350. The test mode setting unit 350 may receive the activated first and second detection signals GIO_L_FAIL and GIO_R_FAIL from the test data processing unit 320, and activate the additional test operation signal RE_TEST in response to the additional test mode signal TMSEQRUPEN. The bank group 310 may perform the test operation for the first sub-bank 311 and the second sub-bank 312 again in response to the additional test operation signal RE_TEST. Accordingly, the test operation is performed, so that it is possible to determine again whether failures have occurred in the first sub-bank 311 and the second sub-bank 312, to latch addresses corresponding to a failed bank group, and to program the latched addresses in the fuse unit.

A repair method of the semiconductor memory device in accordance with the embodiment of the present invention may repair a first sub-bank and a second sub-bank for which a test operation is simultaneously performed, and may include a first step of detecting whether a failure has occurred in the first sub-bank and the second sub-bank using a plurality of pieces of first test data and a plurality of pieces of second test data outputted from the first sub-bank and the second sub-bank, a second step of storing addresses of a corresponding bank of the first sub-bank and the second sub-bank and programming the stored addresses when the failure is detected to have occurred in the corresponding bank in the first step, and a third step of selectively storing addresses of the first sub-bank and the second sub-bank in response to a preset priority and programming the stored addresses when the failure is detected to have occurred in the first sub-bank and the second sub-bank in the first step.

According to the semiconductor memory device in accordance with the embodiment of the present invention, in the repair operation through the self-address rupture for the first sub-bank 311 and the second sub-bank 312, even though failures have simultaneously occurred in the first sub-bank 311 and the second sub-bank 312, it is possible to transfer repair address information to the fuse unit 340 based on a preset priority without a collision of the repair address information. According to the semiconductor memory device, in the repair operation through the self-address rupture, the repair address information is latched by a preset priority of a bank group, so that it is possible to simultaneously perform the repair operations for the first sub-bank 311 and the second sub-bank 312.

Figure 4:
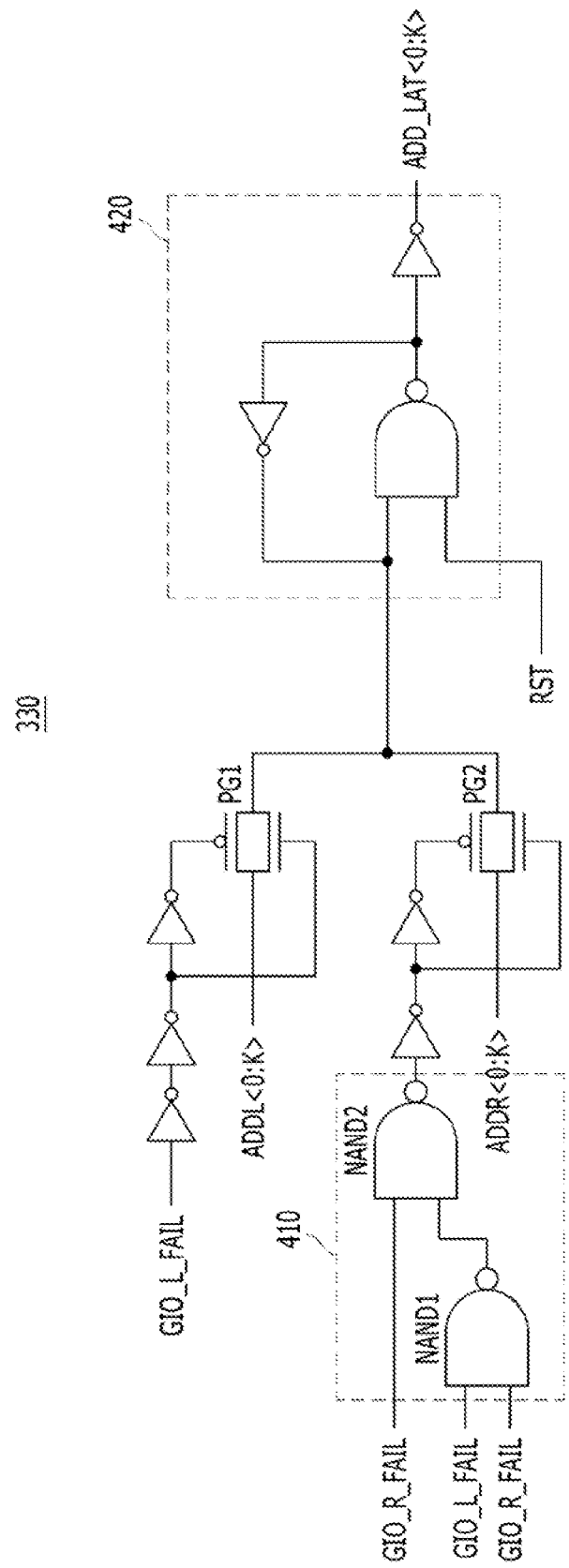
FIG. 4 is a detailed circuit diagram of a repair address control unit illustrated in FIG. 3.

FIG. 4 is a detailed circuit diagram of the repair address control unit 330 illustrated in FIG. 3.

Referring to FIG. 4, the repair address control unit 330 may include a first pass gate PG1, a second pass gate PG2, an output control section 410, and a latching section 420.

The first pass gate PG1 may transfer the first addresses ADDL<0:K> to the latching section 420 in response to the first fail detection signal GIO_L_FAIL having passed through a plurality of inverters.

The output control section 410 may include a first NAND gate NAND1 that receives the first fail detection signal GIO_L_FAIL and the second fail detection signal GIO_R_FAIL, and a second NAND gate NAND2 that receives the second fail detection signal GIO_R_FAIL and an output signal of the first NAND gate NAND1.

The second pass gate PG2 may transfer the second addresses ADDR<0:K> to the latching section 420 in response to an output signal of the output control section 410.

The latching section 420 may latch addresses transferred from the first pass gate PG1 or the second pass gate PG2 and output the latched address as the repair addresses ADDL_LAT<0:K> in a period in which a reset signal RST has been deactivated. The reset signal RST may reset the latch section 420 in a power-up period, or a reboot-up period of a test mode.

An example in which the first fail detection signal GIO_L_FAIL is activated will now be described.

When the first fail detection signal GIO_L_FAIL is activated, the first pass gate PG1 may be driven to transfer the first addresses ADDL<0:K> to the latching section 420. The first. NAND gate NAND1 of the output control section 410 may output a signal having a 'high' level as the second fail detection signal GIO_R_FAIL is deactivated, and the second NAND gate NAND2 of the output control section 410 may output a signal having a 'high' level in response to the output signal of the first NAND gate NAND1 and the deactivated second fail detection signal GIO_R_FAIL. The second pass gate PG2 is not driven in response to a signal which has been outputted from the second NAND gate NAND2 and has passed through a plurality of inverters. As the reset signal is deactivated, the latching section 420 may output the first addresses ADDL<0:K> as the repair addresses ADDL_LAT<0:K>.

Next, an example in which the second fail detection signal GIO_R_FAIL is activated will be described.

As the first fail detection signal GIO_L_FAIL is deactivated, the first pass gate PG1 is not driven. The first NAND gate NAND1 of the output control section 410 may output a signal having a 'high' level as the first fail detection signal GIO_L_FAIL is deactivated, and the second NAND gate NAND2 of the output control section 410 may output a signal having a low' level in response to the output signal of the first NAND gate NAND1 and the activated second fail detection signal GIO_R_FAIL. The second pass gate PG2 may transfer the second addresses ADDR<0:K> to the latching section 420 in response to a signal inverted after being outputted from the second NAND gate NAND2. As the reset signal is deactivated, the latching section 420 may output the second addresses ADDR<0:K> as the repair addresses ADDL_LAT<0:K>.

Then, a description will be provided for an operation of the repair address control unit 330 when the first fail detection signal GIO_L_FAIL and the second fail detection signal GIO_R_FAIL are simultaneously activated.

When the first fail detection signal GIO_L_FAIL is activated, the first pass gate PG1 may be driven to transfer the first addresses ADDL<0:K> to the latching section 420. Furthermore, when the first and second fail detection signals GIO_L_FAIL and GIO_R_FAIL are activated, the first NAND gate NAND1 may output a signal having a 'low' level. The second NAND gate NAND2 may output a signal having a 'high' level in response to the output signal of the first NAND gate NAND1 and the activated second fail detection signal GIO_R_FAIL. The second pass gate PG2 is not driven in response to a signal inverted after being outputted from the second NAND gate NAND2. As a consequence, the latching section 420 may output the first addresses ADDL<0:K> as the repair addresses ADDL_LAT<0:K>.

Then, a repair operation is performed through the repair addresses ADDL_LAT<0:K> and the first fail detection signal GIO_L_FAIL may be deactivated and the second fail detection signal GIO_R_FAIL may be activated again in a next test. Accordingly, as the first fail detection signal GIO_L_FAIL is deactivated, the first NAND gate NAND1 of the output control section 410 may output a signal having a 'high' level, and the second NAND gate NAND2 may output a signal having a low' level in response to the output signal of the first NAND gate NAND1 and the activated second fail detection signal GIO_R_FAIL. The second pass gate PG2 may transfer the second addresses ADDR<0:K> to the latching section 420 in response to a signal inverted after being outputted from the second NAND gate NAND2. As the reset signal is deactivated, the latching section 420 may output the second addresses ADDR<0:K> as the repair addresses ADDL_LAT<0:K>.

Although various embodiments have been described for illustrative purposes, it will be apparent to those skilled in the art that various changes and modifications may be made without departing from the spirit and scope of the invention as defined in the following claims.

What is claimed:

1. A repair circuit comprising:
    a test data processing unit suitable for outputting first and second fail detection signals using first and second test data of first and second memory banks, respectively, in response to a test mode signal;
    a repair address control' unit suitable for setting a priority of the first and second memory banks and selectively storing first and second addresses of the first and second memory banks based on the set priority in response to the first and second fail detection signals; and
    a fuse unit suitable for performing repair programming based on the addresses selectively stored in the repair address control unit.

2. The repair circuit of claim 1, herein the repair address control unit comprises:
    an output control section suitable for selectively outputting the first and second addresses based on the set priority in response to the first and second fail detection signals; and
    a latch section suitable for latching the address selectively outputted from the output control section.

3. The repair circuit of claim 1, wherein the test data processing unit combines the first and second test data and outputs the first and second fail detection signals, respectively, in response to the test mode signal.

4. The repair circuit of claim 3, wherein, when failures occur in the first test data, the test data processing unit activates the first fail detection signal, and when failures occur in the second test data, the test data processing unit activates the second fail detection signal.

5. The repair circuit of claim 1, wherein the fuse unit programs the addresses selectively stored in the repair address control unit as repair address information in response to a rupture enable signal.

6. The repair circuit of claim 1, further comprising:
    a test mode setting unit suitable for generating an additional test operation signal in response to the test mode signal when all the first and second fail detection signals are activated.

7. The repair circuit of claim 6, wherein the additional test operation signal includes a signal for additionally performing a test operation which is performed in response to the test mode signal.

8. The repair circuit of claim 1, wherein the test mode signal includes a signal for performing a self-address rupture operation of the first and second memory banks.

9. The repair circuit of claim 1, wherein the fuse unit includes a fuse set corresponding to the first and second memory banks.

10. The repair circuit of claim 1, further comprising:
    a plurality of memory bank groups includes the first and second memory banks.

11. The repair circuit of claim 10, wherein, when failure occurs in one or more of a plurality of pieces of test data outputted from the plurality of memory banks groups, the test data processing unit outputs the fail detection signal corresponding to the failed test data in response to the test mode signal.

12. The repair circuit of claim 11, wherein the repair address control unit suitable for setting a priority of the plurality of memory bank groups and selectively storing the address based on the set priority in response to the plurality of fail detection signals.

13. A method of operating a repair circuit, comprising:
    setting a priority of first and second memory banks;
    performing a test operation on the first and second memory banks to generate first and second fail detection signals, respectively;
    selectively storing first and second addresses of the first and second memory banks based on the set priority in response to the first and second fail detection signals; and
    programming the selectively stored addresses.

14. The method of claim 13, wherein the performing of the test operation includes:
    combining first and second test data outputted from the first and second memory banks; and
    detecting whether a failure occurs in the first and second memory banks using the combined first and second test data, respectively.

* * * * *